(12) United States Patent
Khorram

(10) Patent No.: US 6,859,646 B2
(45) Date of Patent: Feb. 22, 2005

(54) SIGNAL GAIN ADJUSTMENT WITHIN AN RF INTEGRATED CIRCUIT

(75) Inventor: Shahla Khorram, Los Angeles, CA (US)

(73) Assignee: Broadcom Corp, Irvine, CA (US)

( * ) Notice: Subject to any disclaimer, the term of this patent is extended or adjusted under 35 U.S.C. 154(b) by 404 days.

(21) Appl. No.: 10/132,444

(22) Filed: Apr. 25, 2002

(65) Prior Publication Data

US 2004/0198286 A1 Oct. 7, 2004

(51) Int. Cl.[7] .............................................. H04B 1/06
(52) U.S. Cl. .............................. 455/234.1; 455/245.1; 455/250.1
(58) Field of Search ........................... 455/226.1, 226.2, 455/226.3, 232.1, 234.1, 234.2, 240.1, 241.1, 245.1, 250.1, 251.1, 277.2, 278.1, 296, 164.1, 164.2; 375/317, 320, 327, 345, 346, 350

(56) References Cited

U.S. PATENT DOCUMENTS

| | | | | |
|---|---|---|---|---|
| 5,465,408 A | * | 11/1995 | Sugayama et al. | 455/245.1 |
| 5,603,114 A | * | 2/1997 | Tomita | 455/250.1 |
| 6,208,849 B1 | * | 3/2001 | Cho et al. | 455/296 |
| 6,232,837 B1 | * | 5/2001 | Yoo et al. | 330/151 |
| 6,571,083 B1 | * | 5/2003 | Powell et al. | 455/234.2 |
| 6,741,844 B2 | * | 5/2004 | Medvid et al. | 455/234.1 |
| 2001/0031623 A1 | * | 10/2001 | Masoian | 455/571 |
| 2003/0181180 A1 | * | 9/2003 | Darabi et al. | 455/234.1 |

* cited by examiner

Primary Examiner—Lester G. Kincaid
Assistant Examiner—Sam Bhattacharya
(74) Attorney, Agent, or Firm—Garlick, Harrison & Markison, LLP; Timothy W. Markison

(57) ABSTRACT

A method and apparatus for signal gain adjustment within an RF integrated circuit (IC) include processing that begins by determining the signal strength of a received RF input signal with respect to a first signal strength scale to produce a signal strength indication. The processing continues by determining whether the signal strength indication exceeds a first high power threshold. If not, the receiver continues to process received RF signals without additional attenuation. If, however, the signal strength indication exceeds the first high power threshold, the received RF input signal is attenuated to produce an attenuated RF input signal. In addition, the first signal strength scale is shifted to produce a shifted signal strength scale. The processing continues by determining whether the signal strength of the attenuated RF input signal exceeds a high power threshold of the shifted signal strength scale or is below a low power threshold of the shifted signal strength scale.

16 Claims, 8 Drawing Sheets

SIGNAL GAIN ADJUSTMENT WITHIN AN RF INTEGRATED CIRCUIT

TECHNICAL FIELD OF THE INVENTION

This invention relates generally to wireless communication systems and more particularly to radio frequency integrated circuits used in such wireless communication systems.

BACKGROUND OF THE INVENTION

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. The filtering stage filters the baseband signal or the IF signal to attenuate unwanted out of band signals to produce a filtered signal. The data recovery stage recovers raw data from the filtered signal in accordance with the particular wireless communication standard.

The filtering stage may either be a low pass filter or a band pass filter. In either implementation, the filtering stage functions to pass signals of interest and attenuate unwanted signals. Typically, the unwanted signals are adjacent channels and noise, with the adjacent channels being the dominant source. To insure that the unwanted signals are sufficiently attenuated, the filtering stage should have a sharp roll-off at its corner frequency or frequencies, i.e., the filtering stage should have a high quality factor (Q). However, in wireless communication systems, the Q of the filtering stage cannot be indiscriminately increased to provide the desired roll-off since, under certain operating conditions, the filtering stage will become unstable.

For instance, to provide an adequate Q for filtering 1 MHz spaced adjacent channels, the filtering stage would become unstable when the signal strength of the received RF signal was slightly larger than nominal values (e.g., −40 dBm to −50 dBm). As is known, the signal strength of the received RF signal may vary from −80 dBm to 0 dBm in Bluetooth application. Thus, to accommodate this range of signal strengths, a compromise must be made between lowering the Q and limiting the range of acceptable signals strengths. In many applications, such a compromise is unacceptable.

Therefore, a need exists for a method and apparatus for controlling power levels of received RF signals such that a high Q filtering stage may adequately attenuate unwanted signals and remain stable over the desired operating range.

SUMMARY OF THE INVENTION

The method and apparatus for signal gain adjustment within an RF integrated circuit (IC) of the present invention meet these needs and others. The method and apparatus include processing that begins by determining the signal strength of a received RF input signal with respect to a first signal strength scale to produce a signal strength indication. The signal strength may be determined using a received signal strength indication (RSSI) technique that provides, for example, a 3-bit RSSI value. Accordingly, the first signal strength scale corresponds to the 3-bit RSSI value without a first level of attenuation added to the receiver section of the RFIC.

The processing continues by determining whether the signal strength indication exceeds a first high power threshold. For example, the first high power threshold may correspond to a maximum or near maximum value of the 3-bit RSSI value scale. If not, the receiver continues to process received RF signals without additional attenuation. If, however, the signal strength indication exceeds the first high power threshold, the received RF input signal is attenuated to produce an attenuated RF input signal. In addition, the first signal strength scale is shifted to produce a shifted signal strength scale.

The processing continues by determining whether the signal strength of the attenuated RF input signal exceeds a high power threshold of the shifted signal strength scale or is below a low power threshold of the shifted signal strength scale. If the signal strength of the attenuated RF input signal exceeds the high power threshold of the shifted signal strength scale, the attenuated RF input signals is further attenuated to produce a twice-attenuated RF signal. In addition, the shifted signal strength scale is again shifted to produce a twice-shifted signal strength scale.

If the signal strength of the attenuated RF input signal is below a low power threshold of the shifted signal strength scale, the attenuation of the RF input signal is discontinued such that the receiver is again processing the RF input signal. In addition, the shifting of the signal strength scale is reversed. As such, the processing reverts to the initial processing steps described above.

Further embodiments of the present invention include further attenuation and further shifted of the signal strength scale. In addition, any of the embodiments of the present invention may be incorporated into a receiver section of a radio frequency integrated circuit, standalone RF receiver integrated circuit, and/or discrete component implementation of a radio and/or of a receiver.

DETAILED DESCRIPTION OF A PREFERRED EMBODIMENT

Figure 1:
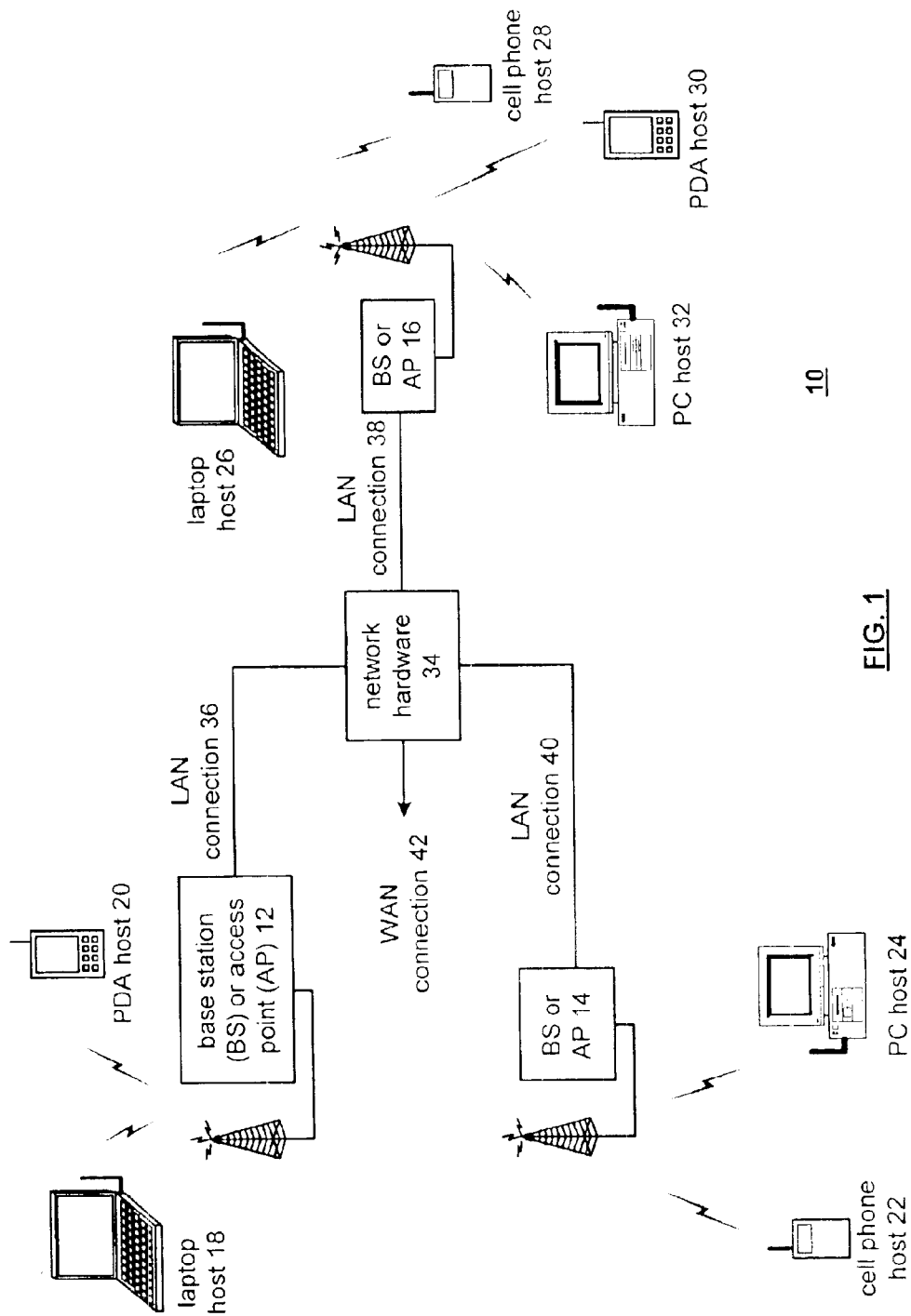
FIG. 1 is a schematic block diagram illustrating a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
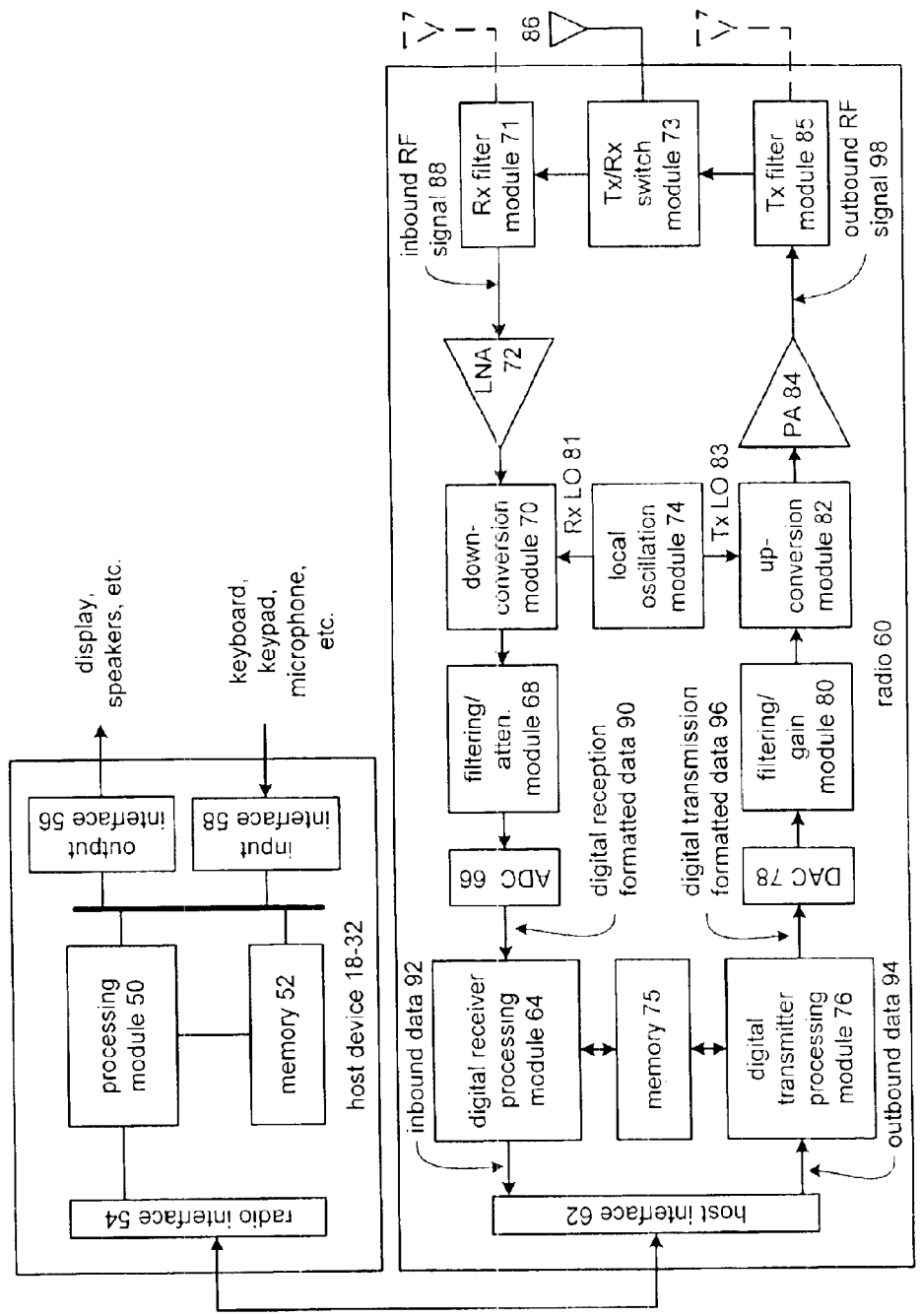
FIG. 2 is a schematic block diagram illustrating a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 77, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 and/or 76 executes, operational instructions corresponding to at least some of the functions illustrated in FIGS. 3–8.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 77, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/attenuation module 68. The filtering/attenuation module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
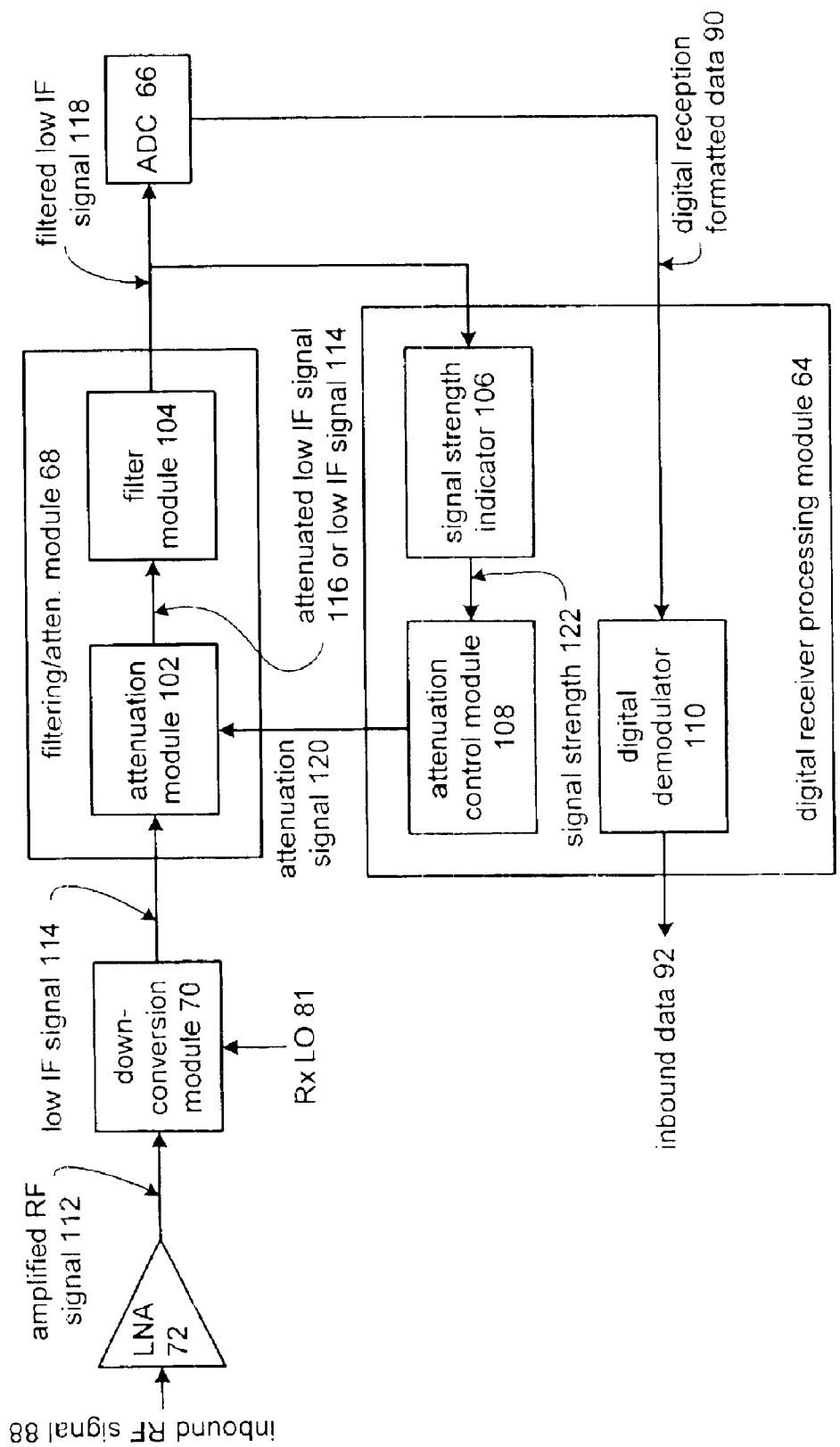
FIG. 3 is a schematic block diagram illustrating an embodiment of a receiver in accordance with the present invention.

FIG. 3 is a schematic block diagram of an embodiment of a receiver section 100 of the radio 60. In this embodiment, the receiver 100 includes the low noise amplifier 72, the down conversion module 70, the filtering/attenuation module 68, the analog to digital converter 66, and the digital receiver processing module 64. The filtering/attenuation module 68 includes an attenuation module 102 and a filter module 104. At least a portion of the digital receiver processing module 64 is configured to include a signal strength indicator 106, an attenuation control module 108 and a digital demodulator 110.

In operation, the low noise amplifier 72 receives the inbound RF signal 88 and amplifies it to produce an amplified RF signal 112. The down conversion module 70 mixes the amplified RF signal 112 with the receiver local oscillation 81 to produce a low IF signal 114. The low IF signal 114 may be a baseband signal or have a carrier frequency of one hundred kilohertz to a few megahertz. The resulting low IF signal 114 may be a complex differential signal, complex single-ended signal, differential signal, or a single-ended signal.

The attenuation module 102 receives the low IF signal 114 and either passes it unattenuated or attenuates it based on the attenuation signal 120. The attenuation signal 120 is activated when the power level of the inbound RF signal is above a desired power level. For instance, when the power level of the inbound RF signal is determined to be above a threshold, the attenuation signal 120 is placed in a first state (e.g., a logic one), which instructs the attenuation module 102 to attenuate the low IF signal 114 thereby producing an attenuated low IF signal 116. The amount of attenuation may vary from a few decibels to tens of decibels depending on the particular application, range of the signal strength indicator, and input power range of the inbound RF signal. When the power level of the inbound RF signal is determined to be below the threshold, the attenuation signal 120 is placed in a second state (e.g., a logic zero), which instructs the attenuation module 102 to pass the low IF signal 114 without attenuation.

The filter module 104, which may be a high Q bandpass filter or a high Q low pass filter, filters the attenuated low IF signal 116 or the low IF signal 114. The quality factor of the filter module 104 is of a value that adequately attenuates interference from adjacent channels and other unwanted signals. Accordingly, by attenuating the low IF signal 114 when the power level of the inbound RF signal is too high, a high Q filter module remains linear, i.e., stable, over all operating conditions of the receiver.

The analog to digital converter 66 converts the filtered low IF signal 118 into the digital reception formatted data 90. The signal strength indicator 106 and the digital demodulator 110 receive the digital reception formatted data 90. The digital demodulator 110, in accordance with the particular wireless communication standard of the radio, demodulates, descrambles, and/or decodes the digital reception formatted data 90 to produce the inbound data 92.

The signal strength indicator 106, which may be a received signal strength indicator (RSSI) and may be a separate component from the digital receiver processing module 64, interprets the filtered low IF signal 118 to determine a signal strength indication 122. In one embodiment, the signal strength indicator 106 is a 3-bit, 8-level RSSI module. As one of average skill in the art will appreciate, the signal strength indicator 106 may be implemented using more bits and have correspondingly more RSSI levels, may be a signal to noise ratio module, and/or packet error detector.

The attenuation control module 108 receives the signal strength indication 122 and compares it to a high power threshold. If the signal strength indication 122 exceeds the high power threshold, the attenuation control module 108 generates the attenuation signal 120 to be in the first state (i.e., enables the attenuation module 102 to attenuate the low IF signal 114). Conversely, if the signal strength indication 122 does not exceed the high power threshold, the attenuation control module 108 generates the attenuation signal 120 to be in the second state (i.e., enables the attenuation module 102 to pass the low IF signal 114 without attenuation).

Figure 4:
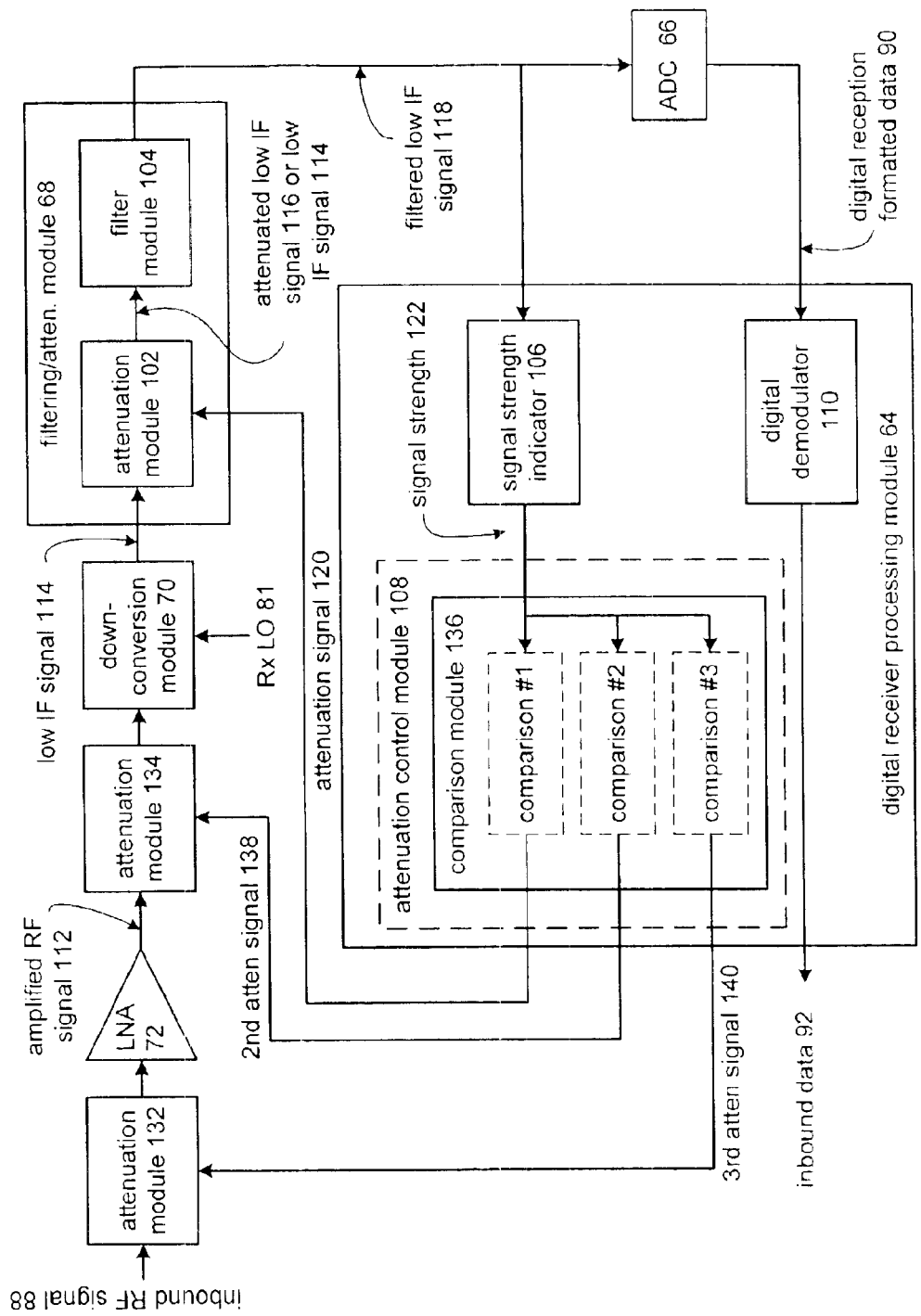
FIG. 4 is a schematic block diagram illustrating an alternate embodiment of a receiver in accordance with the present invention.

FIG. 4 is a schematic block diagram of an alternate embodiment of a receiver section 130 of the radio 60. In this embodiment, the receiver 100 includes an attenuation module 132, the low noise amplifier 72, an attenuation module 134, the down conversion module 70, the filtering/attenuation module 68, the analog to digital converter 66, and the digital receiver processing module 64. The filtering/attenuation module 68 includes the attenuation module 102 and the filter module 104. At least a portion of the digital receiver processing module 64 is configured to include the signal strength indicator 106, the attenuation control module 108 and the digital demodulator 110. The attenuation control module 108 includes a comparison module 136 that performs three comparisons: comparison #1, comparison #2, and comparison #3.

In operation, the attenuation module 132 receives the inbound RF signal 88 and either passes it or attenuates it based on the third attenuation signal 140. For instance, when the third attenuation signal 140 is in a first state, the attenuation module 132 attenuates the inbound RF signal 88 to produce an attenuated inbound RF signal. If, however, the third attenuation signal 140 is in a second state, the attenuation module 132 passes the inbound RF signal 88 without attenuation. The generation of the third attenuation signal 140 will be discussed in greater detail with reference to the attenuation control module 108 and the graph of FIG. 5. As one of average skill in the art will appreciate, the amount of attenuation may vary from a few decibels to tens of decibels depending on the particular application, range of the signal strength indicator, input power range of the inbound RF signal, and number of attenuation modules.

The low noise amplifier 72 receives the inbound RF signal 88 or the attenuated RF signal and amplifies it to produce an amplified RF signal 112. Attenuation module 134 receives the amplified RF signal 112 and attenuates it when the second attenuation signal 138 is in a first state and passes the amplified RF signal 112 when the second attenuation signal 138 is in a second state. The generation of the second attenuation signal 130 will be discussed in greater detail with reference to the attenuation control module 108 and the graph of FIG. 5. As one of average skill in the art will appreciate, the amount of attenuation may vary from a few decibels to tens of decibels depending on the particular application, range of the signal strength indicator, input power range of the inbound RF signal, and number of attenuation modules.

The down conversion module 70 mixes the amplified RF signal 112 or the attenuated and amplified RF signal with the receiver local oscillation 81 to produce a low IF signal 114. The low IF signal 114 may be a baseband signal or have a carrier frequency of one hundred kilohertz to a few megahertz. The resulting low IF signal 114 may be a complex differential signal, complex single-ended signal, differential signal, or a single-ended signal.

The attenuation module 102 receives the low IF signal 114 and either passes it unattenuated or attenuates it based on the attenuation signal 120. The filter module 104 filters the attenuated low IF signal 116 or the low IF signal 114. The quality factor of the filter module 104 is of a value that adequately attenuates interference from adjacent channels and other unwanted signals. Accordingly, by attenuating the low IF signal 114 and/or the inbound RF signal in one or more attenuation modules when the power level of the inbound RF signal is too high, a high Q filter module remains linear, i.e., stable, over all operating conditions of the receiver.

The analog to digital converter 66 converts the filtered low IF signal 118 into the digital reception formatted data 90. The signal strength indicator 106 receives the filtered low IF signal 118 and the digital demodulator 110 receives the digital reception formatted data 90. The digital demodulator 110, in accordance with the particular wireless communication standard of the radio, demodulates, descrambles, and/or decodes the digital reception formatted data 90 to produce the inbound data 92.

The signal strength indicator 106 interprets the filtered low IF signal 118 to determine a signal strength indication 122. In this embodiment, the signal strength indication 122 may correspond to the unattenuated RF signal 88, once attenuated RF signal, twice attenuated RF signal, or thrice attenuated RF signal. For the unattenuated RF signal 88, the comparison module 136 performs the first comparison, which compares the signal strength of the unattenuated RF signal to a first high power threshold. If the signal strength indication 122 of the unattenuated RF signal exceeds the first high power threshold, the attenuation control module 108 generates the attenuation signal 120 to be in the first state (i.e., enables the attenuation module 102 to attenuate the low IF signal 114). Conversely, if the signal strength indication 122 does not exceed the high power threshold, the attenuation control module 108 generates the attenuation signal 120 to be in the second state (i.e., enables the attenuation module 102 to pass the low IF signal 114 without attenuation).

While attenuation module 102 is attenuating the low IF signal 114, the comparison module 136 is performing the second comparison, which compares signal strength of the once attenuated RF signal with a second high power threshold and with a first low power threshold. If the signal strength indication 122 of the once attenuated RF signal exceeds the second high power threshold, the attenuation control module 108 generates the second attenuation signal 138 to be in the first state (i.e., enables attenuation module 134 to attenuate the amplified RF signal 112). Conversely, if the signal strength indication 122 does not exceed the second high power threshold, the attenuation control module 108 generates the second attenuation signal 138 to be in the second state (i.e., enables the attenuation module 134 to pass the amplified RF signal 112 without attenuation).

If the signal strength indication 122 of the once attenuated RF signal is below the first low power threshold, the attenuation control module 108 generates the attenuation signal 120 to be in the second state (i.e., enables the attenuation module 102 to pass the low IF signal 114 without attenuation). At this point, the attenuation module 108 is again comparing the signal strength of the unattenuated RF signal with the first high power threshold via comparison #1.

While attenuation module 134 is attenuating the amplified RF signal 112, the comparison module 136 is performing the third comparison, which compares signal strength of the twice attenuated RF signal with a third high power threshold and with a second low power threshold. If the signal strength indication 122 of the twice attenuated RF signal exceeds the third high power threshold, the attenuation control module 108 generates the third attenuation signal 140 to be in the first state (i.e., enables attenuation module 132 to attenuate the RF signal 88). Conversely, if the signal strength indication 122 does not exceed the third high power threshold, the attenuation control module 108 generates the third attenuation signal 140 to be in the second state (i.e., enables the attenuation module 132 to pass the RF signal 88 without attenuation).

If the signal strength indication 122 of the twice attenuated RF signal is below the second low power threshold, the attenuation control module 108 generates the second attenuation signal 138 to be in the second state (i.e., enables the attenuation module 134 to pass the amplified RF signal without attenuation). At this point, the attenuation module 108 is again comparing the signal strength of the once attenuated RF signal with the second high power threshold and the first low power threshold via comparison #2.

Figure 5:
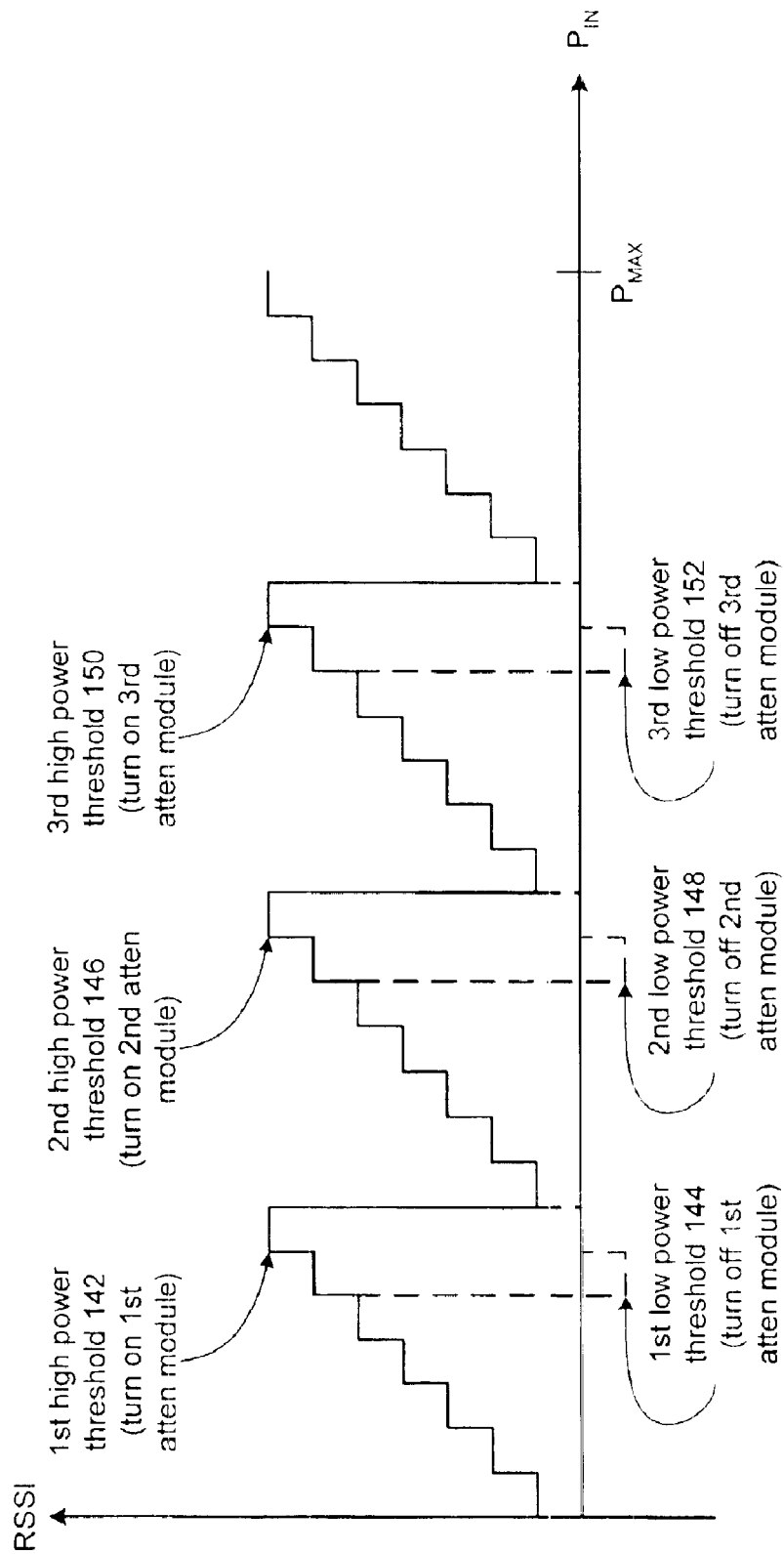
FIG. 5 is a graph of signal strength indication versus RF signal input power and the corresponding scale shifting and increased attenuation in accordance with the present invention.

FIG. 5 is a graph that illustrates the first, second, and third comparisons performed by the attenuation control module 108 of FIG. 4. As shown, the vertical axis corresponds to signal strength and the horizontal axis corresponds to input power of the RF signal. When the input power is low, and hence the RSSI is low, all of the attenuation modules 102, 134 and 132 are passing their respective input signals without attenuation. As also shown, as the power increases from its lowest value, the RSSI increases in steps. In this illustration, when the "top step" of the first series of steps is reached, which corresponds to the first high power threshold 142, the first attenuation module 102 is enabled.

For input powers above the first high power threshold, the signal strength scale is shifted as shown. While the input power is within this series of steps, the attenuation control module 108 is comparing the RSSI with a second high power threshold 146 and a first low power threshold 144. As such, if the input power continues to increase and exceeds the second high power threshold, the second attenuation module 134 is enabled and the signal strength scale is again shifted as shown. If, however, the input power decreases below the first low power threshold, the first attenuation module 102 is turned off (i.e., allows the low IF signal to pass without attenuation) and the first shifting of the signal strength scale is reversed. As shown, the first low power threshold is at an input power level than the first high power threshold. This provides hysteresis to prevent the first attenuation module 102 from toggling on and off when the input power level is a threshold.

If the input power continues to increase and exceeds the third high power threshold 150, the third attenuation module 132 is enabled and the signal strength scale is again shifted as shown to produce a thrice shifted signal strength scale. If, however, the input power decreases below the second low power threshold 148, the second attenuation module 134 is turned off and the second shifting of the signal strength scale is reverse.

With the input power in the thrice-shifted signal scale range, the attenuation control module 108 determines whether the power level drops below the third low power threshold. If it does, the third attenuation module 132 is turned off and the third shifting of the signal strength scale is reverse.

Figure 6:
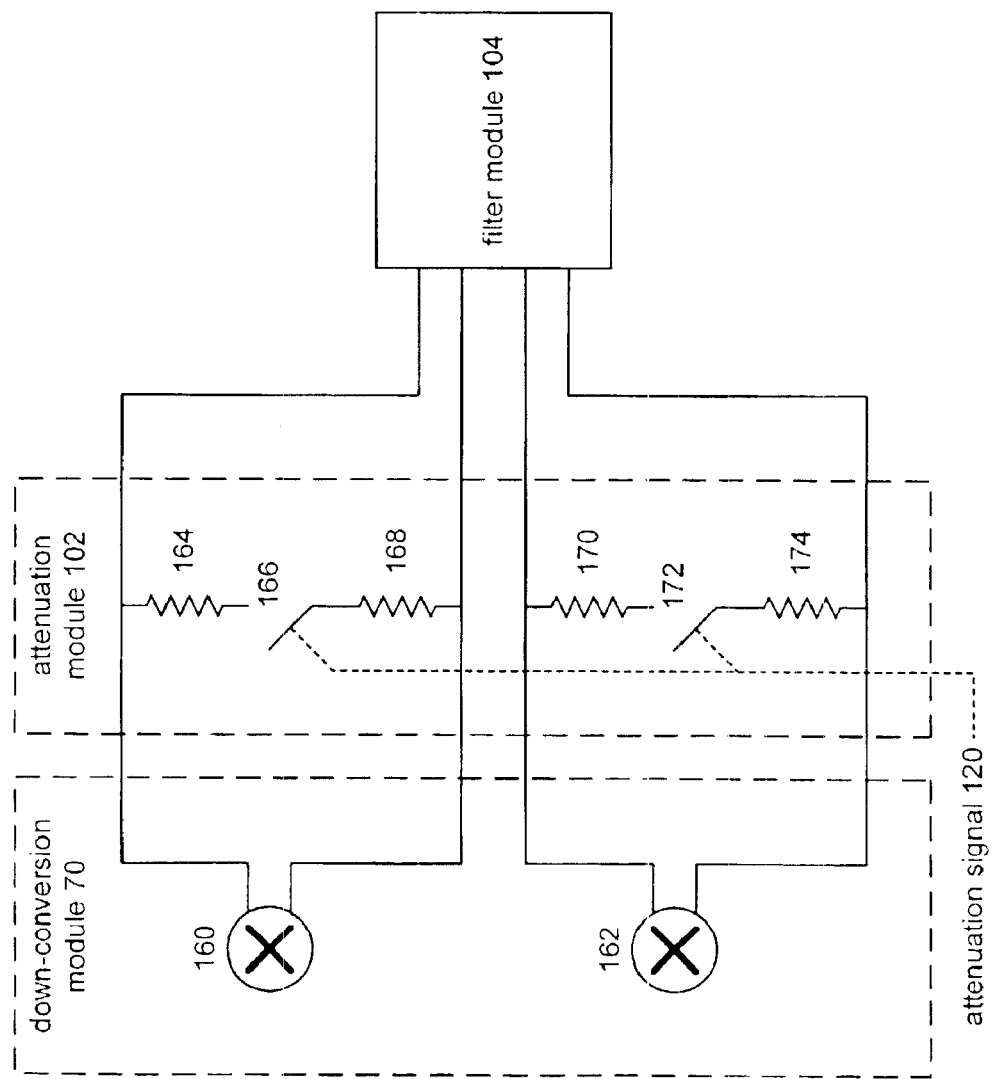
FIG. 6 is a schematic block diagram illustrating an embodiment of an attenuation module in accordance with the present invention.

FIG. 6 is a schematic block diagram illustrating an embodiment of the attenuation module 102. As shown, the down conversion module 70 includes two differential mixers 160 and 162 that collectively provide low IF signal 114. The attenuation module 102 includes two switchable impedance circuits coupled across the differential outputs of each mixer 160 and 162. The first switchable impedance circuit includes resistors 164 and 168 and switch 166; the second switchable impedance circuit includes resistors 170 and 174 and switch 172. When the attenuation signal 122 is in the second state, the switches 166 and 172, which may be bidirectional transistor pairs, are open. As such, the low IF signal 114 from the down conversion module 70 passes through the attenuation module 102 without attenuation.

When the attenuation signal 122 is in the first state, the switches 166 and 172 are closed such that an impedance is imposed across each differential signal. The values of the resistors 164, 168, 170, and 172, in relation to the input impedance of the filter module 104, establishes the attenuation of the attenuation module 102.

Figure 7:
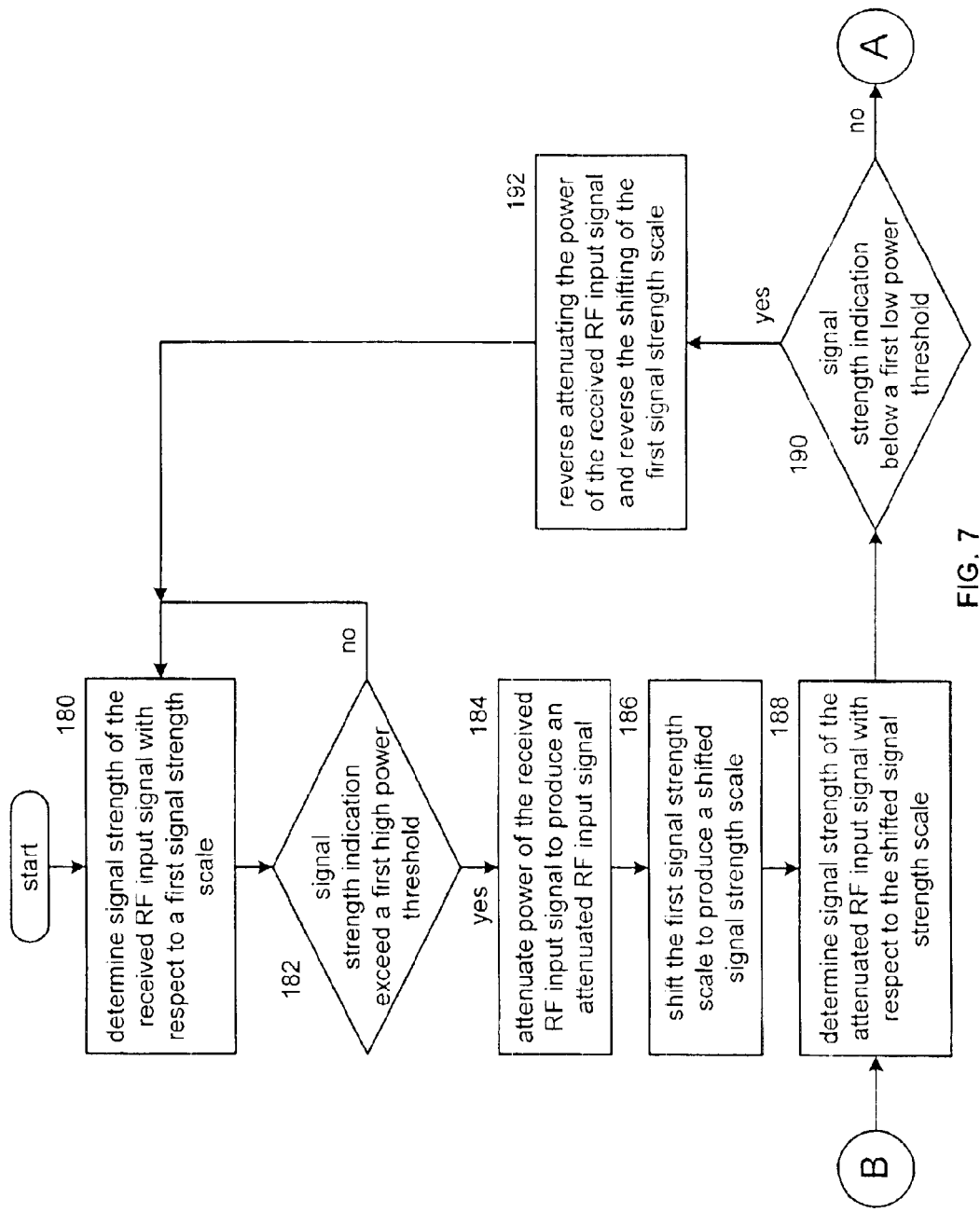
FIGS. 7 and 8 are a flow chart illustrating a method for adjusting gain of an RF signal in accordance with the present invention.
Figure 8:
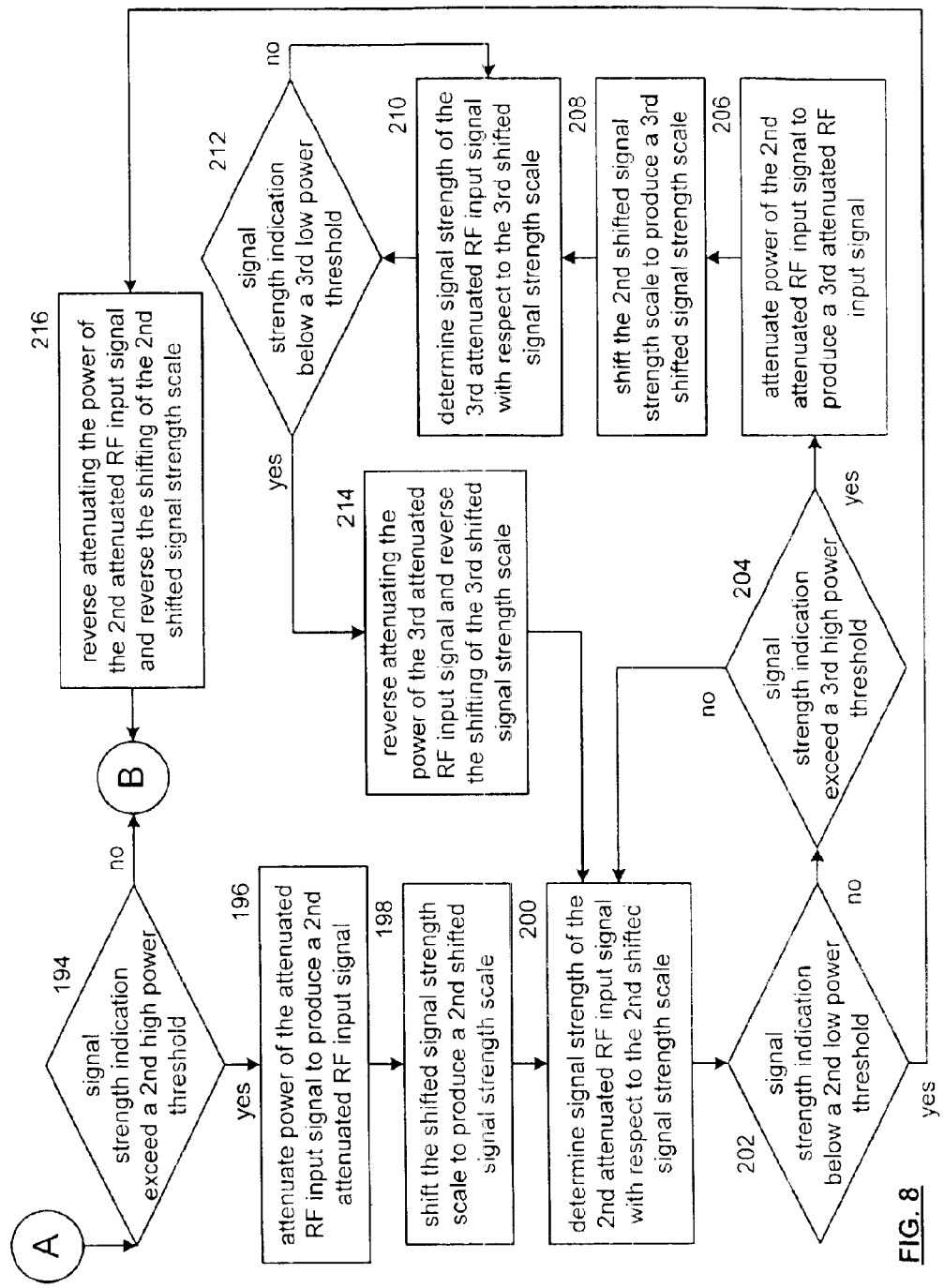

FIGS. 7 and 8 are a flow chart of a method for adjusting gain of a received RF input signal. The process begins at step 180 where the receiver determines the signal strength of the received RF input signal with respect to a first signal strength scale to produce a signal strength indication. The process continues at step 182 where the receiver determines whether the signal strength indication exceeds a first high power threshold. If not, the process repeats at step 180. If, however, the signal strength indication exceeds the first high power threshold, the process proceeds to step 184 where the receiver attenuates power of the received RF input signal to produce an attenuated RF input signal.

The process then proceeds to step 186 where the receiver shifts the first signal strength scale to produce a shifted signal strength scale. The process then proceeds to step 188 where the receiver determines the signal strength of the attenuated RF input signal with respect to the shifted signal strength scale to produce an attenuated signal strength indication. The process then proceeds to step 190 where the receiver determines whether the signal strength of the attenuated RF input signal is below a first low power threshold of the shifted signal strength scale, wherein the power of the received RF input signal at the first low power threshold is less than the power of the received RF input signal at the first high power threshold to provide hysteresis. If yes, the process proceeds to step 192, where the receiver reverses the attenuating of the power of the received RF input signal, reversing the shifting of the first signal strength scale, and resumes the determining whether the signal strength indication exceeds a first high power threshold at step 180.

When the signal strength of the attenuated RF signal is not below the first low power threshold, the process proceeds to step 194 (of FIG. 8) where the receiver determines whether the attenuated signal strength indication is above a second high power threshold of the shifted signal strength scale. If not, the process reverts back to step 188 (of FIG. 7). If the signal strength indication exceeds the second high power threshold of the shifted signal strength scale, the process proceeds to step 196 where the receiver further attenuates the power of the received RF input signal to produce a second attenuated RF input signal. The process then proceeds to step 198, where the receiver shifts the shifted signal strength scale to produce a second shifted signal strength scale. The process then proceeds to step 200 where the receiver determines signal strength of the second attenuated RF input signal with respect to the second shifted signal strength scale to produce a second attenuated signal strength indication.

The process then proceeds to step 202 where the receiver determines whether the second attenuated signal strength indication is below a second low power threshold of the second shifted signal strength scale, wherein the power of the received RF input signal at the second low power threshold of the second shifted signal strength scale is less than the power of the received RF input signal at the high power threshold of the shifted signal strength scale to provide hysteresis. If yes, the process proceeds to step 216 where the receiver reverses the further attenuating of the power of the received RF input signal, reverses the shifting of the shifted signal strength scale, and resumes determining whether the attenuated signal strength indication exceeds the high power threshold of the shifted signal strength scale or is below a first low power threshold of the shifted signal strength scale at step 188 of FIG. 7.

If the second attenuated signal strength indication is below a second low power threshold of the second shifted signal strength scale, the process proceeds to step 204 where the receiver determines whether the second attenuated signal strength indication exceeds a third high power threshold. If not, the process reverts to step 200. If the second attenuated signal strength indication exceeds the third high power threshold, the process proceeds to step 206 where the receiver attenuates power of the second attenuated RF input signal to produce a third attenuated RF input signal. The process then proceeds to step 208 where the receiver shifts the second signal strength scale to produce a third shifted signal strength scale. The process then proceeds to step 210 where the receiver determines the signal strength of the twice-attenuated RF input signal with respect to the twice-shifted signal strength scale to produce a third attenuated signal strength indication.

The process then proceeds to step 212 where the receiver determines whether the third attenuated signal strength indication is below a third low power threshold of the third shifted signal strength scale. If not, the process reverts back to step 210. If, however, the third attenuated signal strength indication is below a third low power threshold the process proceeds to step 214 where the receiver reverses the attenuation of the power of the third attenuated RF signal and reverses the third shifting of the signal strength scale. The process then reverts to step 200.

The preceding discussion has presented a method and apparatus for adjusting power of an RF signal to provide stability to a high Q filter module. As one of average skill in the art will appreciate, other embodiments may be derived from the teachings of the present invention without deviating from the scope of the claims.

What is claimed is:

1. A method for adjusting gain of a received radio frequency (RF) input signal within a RF integrated circuit (IC), the method comprises:

determining signal strength of the received RF input signal with respect to a first signal strength scale to produce a signal strength indication;

determining whether the signal strength indication exceeds a first high power threshold;

when the signal strength indication exceeds the first high power threshold, attenuating power of the received RF input signal to produce an attenuated RF input signal;

shifting the first signal strength scale to produce a shifted signal strength scale;

determining signal strength of the attenuated RF input signal with respect to the shifted signal strength scale to produce an attenuated signal strength indication;

determining whether the attenuated signal strength indication is below a first low power threshold of the shifted signal strength scale, wherein the power of the received RF input signal at the first low power threshold is less than the power of the received RF input signal at the first high power threshold to provide hysteresis;

when the attenuated signal strength indication is below a first low power threshold of the shifted signal strength scale:

reversing the attenuating of the power of the received RF input signal;

reversing the shifting of the first signal strength scale; and resuming the determining whether the signal strength indication exceeds a first high power threshold.

2. The method of claim 1 further comprises:

determining whether the attenuated signal strength indication is above a high power threshold of the shifted signal strength scale;

when the signal strength indication exceeds the high power threshold of the shifted signal strength scale, further attenuating the power of the received RF input signal to produce a second attenuated RF input signal;

shifting the shifted signal strength scale to produce a second shifted signal strength scale; and determining signal strength of the second attenuated RF input signal with respect to the second shifted signal strength scale to produce a second attenuated signal strength indication.

3. The method of claim 2 further comprises:

determining whether the second attenuated signal strength indication is below a low power threshold of the second shifted signal strength scale, wherein the power of the received RF input signal at the low power threshold of the second shifted signal strength scale is less than the power of the received RF input signal at the high power threshold of the shifted signal strength scale to provide hysteresis;

when the second attenuated signal strength indication is below the low power threshold of the second shifted signal strength scale:
  reversing the further attenuating of the power of the received RF input signal;
  reversing the shifting of the shifted signal strength scale; and
  resuming the determining whether the attenuated signal strength indication exceeds the high power threshold of the shifted signal strength scale or is below a first low power threshold of the shifted signal strength scale.

4. A radio receiver comprises:
low noise amplifier operably coupled to amplify a radio frequency (RF) input signal to produce an amplified RF input signal;
mixing module operably coupled to mix the amplified RF input signal with a local oscillation to produce a low intermediate frequency (IF) signal;
attenuation module operably coupled to attenuate power of the low IF signal when an attenuation signal is in a first state to produce an attenuated low IF signal and to pass the low IF signal when the attenuation signal is in a second state;
filter operably coupled to filter the attenuated low IF signal or the low IF signal to produce a filtered low IF signal;
signal strength module operably coupled to determined signal strength of the filtered low IF signal; and
attenuation control module operably coupled to generate the attenuation signal based on the signal strength of the filtered low IF signal, wherein the attenuation control module includes comparison module operably coupled to compare the signal strength of the filtered low IF signal with a first high power threshold when the filter is filtering the low IF signal, wherein the comparison module generates the attenuation signal to be in the first state when the signal strength of the filtered low IF signal equals or exceeds the first high power threshold and generates the attenuation signal to be in the second state when the signal strength of the filtered low IF signal is below the first high power threshold; and wherein
the comparison module comparing the signal strength of the filtered low IF signal with a first low power threshold when the filter is filtering the attenuated IF signal, wherein the comparison module generates the attenuation signal to be in the first state when the signal strength of the filtered low IF signal is above the first low power threshold and generates the attenuation signal to be in the second sate when the signal strength of the filtered low IF signal equals or is below the first low power threshold, wherein the first low power threshold corresponds to a power level of the RF signal that is less than the power of level of the RF signal corresponding to the first high power threshold.

5. The radio receiver of claim 4 further comprises:
second attenuation module operably coupled to attenuate the amplified RF input signal when a second attenuation signal is in a first state to produce an attenuated and amplified RF input signal and to pass the amplified RF input signal when the second attenuation signal is in a second state,
wherein the comparison module compares the signal strength of the filtered low IF signal with a second high power threshold when the attenuation signal is in the first state, wherein when the signal strength of the filtered low IF signal is equal to or exceeds the second high power threshold, the comparison module generates the second attenuation signal to be in the first state and, when the signal strength of the filtered low IF signal is below the second high power threshold, the comparison module generates the second attenuation signal to be in the second state.

6. The radio receiver of claim 5 further comprises:
third attenuation module operably coupled to attenuate the RF input signal when a third attenuation signal is in a first state to an attenuated RF input signal and to pass the RF input signal when the third attenuation signal is in a second state,
wherein the comparison module compares the signal strength of the filtered low IF signal with a third high power threshold when the second attenuation signal is in the first state, wherein, when the signal strength of the filtered low IF signal is equal to or exceeds the third high power threshold, the comparison module generates the third attenuation signal to be in the first state and, when the signal strength of the filtered low IF signal is below the third high power threshold, the comparison module generates the third attenuation signal to be in the second state.

7. The radio receiver of claim 6 further comprises:
the comparison module comparing the signal strength of the filtered low IF signal with a third low power threshold when the third attenuation signal is in the first state, wherein, when the signal strength of the filtered low IF signal is equal to or below the third low power threshold, the comparison module adjusts the third attenuation signal to be in the second state.

8. The radio receiver of claim 7 further comprises:
the comparison module comparing the signal strength of the filtered low IF signal with a second low power threshold when the second attenuation signal is in the first state and the third attenuation signal is in the second state, wherein the comparison module adjusts the second attenuation signal to the second state when the signal strength of the filtered low IF signal is equal to or below the second low power threshold.

9. A method for producing a filtered low intermediate frequency (IF) signal from a radio frequency (RF) signal, the method comprises:
amplifying the RF signal to produce an amplified RF signal;
mixing the amplified RF input signal with a local oscillation to produce a mixed low IF signal;
attenuating the mixed low IF signal when an attenuation signal is in a first state to produce an attenuated low IF signal;
passing the mixed low IF signal when the attenuation signal is in a second state;
filtering the attenuated low IF signal or the low IF signal to produce a filtered low IF signal;
determining signal strength of the filtered low IF signal;
generating the attenuation signal based on the signal strength of the filtered low IF signal;

comparing the signal strength of the filtered low IF signal with a first high power threshold when the filter is filtering the low IF signal;

generating the attenuation signal to be in the first state when the signal strength of the filtered low IF signal equals or exceeds the first high power threshold;

generating the attenuation signal to be in the second state when the signal strength of the filtered low IF signal is below the first high power threshold;

comparing the signal strength of the filtered low IF signal with a first low power threshold when the filter is filtering the attenuated IF signal;

generating the attenuation signal to be in the first state when the signal strength of the filtered low IF signal is above the first low power threshold; and generating the attenuation signal to be in the second sate when the signal strength of the filtered low IF signal equals or is below the first low power threshold, wherein the first low power threshold corresponds to a power level of the RF signal that is less than the power of level of the RF signal corresponding to the first high power threshold.

10. The method of claim 9 further comprises:

attenuating the amplified RF input signal when a second attenuation signal is in a first state to produce an attenuated and amplified RF input signal;

passing the amplified RF input signal when the second attenuation signal is in a second state;

comparing the signal strength of the filtered low IF signal with a second high power threshold when the attenuation signal is in the first state;

generating the second attenuation signal to be in the first state when the signal strength of the filtered low IF signal is equal to or exceeds the second high power threshold; and generating the second attenuation signal to be in the second state when the signal strength of the filtered low IF signal is below the second high power threshold.

11. The method of 10 claim further comprises:

attenuating the RF input signal when a third attenuation signal is in a first state to an attenuated RF input signal;

passing the RF input signal when the third attenuation signal is in a second state;

comparing the signal strength of the filtered low IF signal with a third high power threshold when the second attenuation signal is in the first state;

generating the third attenuation signal to be in the first state when the signal strength of the filtered low IF signal is equal to or exceeds the third high power threshold; and generating the third attenuation signal to be in the second state when the signal strength of the filtered low IF signal is below the third high power threshold.

12. The method of claim 11 further comprises:

comparing the signal strength of the filtered low IF signal with a third low power threshold when the third attenuation signal is in the first state; and adjusting the third attenuation signal to be in the second state when the signal strength of the filtered low IF signal is equal to or below the third low power threshold.

13. The method of claim 12 further comprises:

comparing the signal strength of the filtered low IF signal with a second low power threshold when the second attenuation signal is in the first state and the third attenuation signal is in the second state; and adjusting the second attenuation signal to the second state when the signal strength of the filtered low IF signal is equal to or below the second low power threshold.

14. An apparatus for adjusting gain of a received radio frequency (RF) input signal within a RF integrated circuit (IC), the apparatus comprises:

processing module; and memory operably coupled to the processing module, wherein the memory includes operational instructions that cause the processing module to:

determine signal strength of the received RF input signal with respect to a first signal strength scale to produce a signal strength indication;

determine whether the signal strength indication exceeds a first high power threshold;

when the signal strength indication exceeds the first high power threshold, attenuate power of the received RF input signal to produce an attenuated RF input signal;

shift the first signal strength scale to produce a shifted signal strength scale; and determine signal strength of the attenuated RF input signal with respect to the shifted signal strength scale to produce an attenuated signal strength indication, wherein the memory further includes operational instructions that cause the processing module to:

determine whether the attenuated signal strength indication is below a first low power threshold of the shifted signal strength scale, wherein the power of the received RF input signal at the first low power threshold is less than the power of the received RF input signal at the first high power threshold to provide hysteresis;

when the attenuated signal strength indication is below a first low power threshold of the shifted signal strength scale:

reverse the attenuating of the power of the received RF input signal;

reverse the shifting of the first signal strength scale; and resume the determining whether the signal strength indication exceeds a first high power threshold.

15. The apparatus of claim 14, wherein the memory further comprises operational instructions that cause the processing module to:

determine whether the attenuated signal strength indication is above a high power threshold of the shifted signal strength scale;

when the signal strength indication exceeds the high power threshold of the shifted signal strength scale, further attenuate the power of the received RF input signal to produce a second attenuated RF input signal;

shift the shifted signal strength scale to produce a second shifted signal strength scale; and determine signal strength of the second attenuated RF input signal with respect to the second shifted signal strength scale to produce a second attenuated signal strength indication.

16. The apparatus of claim 15, wherein the memory further comprises operational instructions that cause the processing module to:

determine whether the second attenuated signal strength indication is below a low power threshold of the second shifted signal strength scale, wherein the power of the received RF input signal at the low power threshold of the second shifted signal strength scale is less than the power of the received RF input signal at the high power threshold of the shifted signal strength scale to provide hysteresis;

when the second attenuated signal strength indication is below the low power threshold of the second shifted signal strength scale:

reverse the further attenuating of the power of the received RF input signal;

reverse the shifting of the shifted signal strength scale; and resume the determining whether the attenuated signal strength indication exceeds the high power threshold of the shifted signal strength scale or is below a first low power threshold of the shifted signal strength scale.

* * * * *